(12) United States Patent
Chen et al.

(10) Patent No.: US 10,314,394 B2
(45) Date of Patent: Jun. 11, 2019

(54) RAIL MOUNTING ADAPTER ASSEMBLY FOR RACK

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Yao-Tsung Chen, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/458,986

(22) Filed: Mar. 15, 2017

(65) Prior Publication Data
US 2018/0084907 A1 Mar. 29, 2018

(30) Foreign Application Priority Data
Sep. 24, 2016 (TW) .............................. 105131170 A (51) Int. Cl.
A47B 57/34 (2006.01)
H05K 7/14 (2006.01)
A47B 96/07 (2006.01)
H05K 7/18 (2006.01)

(52) U.S. Cl.
CPC .............. *A47B 57/34* (2013.01); *A47B 96/07* (2013.01); *H05K 7/1489* (2013.01); *H05K 7/183* (2013.01)

(58) Field of Classification Search
CPC ......... A47B 57/34; A47B 96/07; A47B 88/43; H05K 7/1489; H05K 7/183; H05K 7/1488
See application file for complete search history.

(56) References Cited

U.S. PATENT DOCUMENTS

| 3,050,194 | A | * | 8/1962 | Sinninger | .............. A47B 47/03 108/106 |
| 5,571,256 | A | | 11/1996 | Good | |
| 5,779,333 | A | * | 7/1998 | Lautenschlager | ...... A47B 88/43 312/334.14 |
| 5,833,337 | A | * | 11/1998 | Kofstad | ............... H05K 7/1421 312/334.5 |
| 5,836,562 | A | * | 11/1998 | Danzyger | .......... A47B 21/0314 248/295.11 |

(Continued)

FOREIGN PATENT DOCUMENTS

| JP | H01-160874 U | 11/1989 |
| JP | H02-8188 U | 1/1990 |

(Continued)

*Primary Examiner* — Patrick D Hawn
(74) *Attorney, Agent, or Firm* — Winston Hsu (57) ABSTRACT

A rack system includes a rack, a first adapter mechanism and a second adapter mechanism. The rack has a first side and second side. A first width is defined between the first side and the second side. The first adapter mechanism is detachably mounted to the first side of the rack. The second adapter mechanism is detachably mounted to the second side of the rack. A second width is defined between the first adapter mechanism and the second adapter mechanism. The second width is smaller than the first width.

6 Claims, 8 Drawing Sheets

(56) References Cited

U.S. PATENT DOCUMENTS

| | | | | |
|---|---|---|---|---|
| 5,941,621 A * | 8/1999 | Boulay | H05K 7/1421 | 248/906 |
| 6,070,957 A * | 6/2000 | Zachrai | H02B 1/32 | 312/265.1 |
| 6,190,081 B1 * | 2/2001 | Besserer | H02B 1/32 | 211/183 |
| 6,209,979 B1 * | 4/2001 | Fall | H05K 7/1489 | 312/319.1 |
| 6,273,534 B1 * | 8/2001 | Bueley | A47B 46/005 | 211/187 |
| 6,431,668 B1 * | 8/2002 | Reddicliffe | A47B 88/43 | 312/334.1 |
| 6,554,142 B2 * | 4/2003 | Gray | A47B 57/30 | 211/175 |
| 6,615,992 B1 * | 9/2003 | Lauchner | H05K 7/1489 | 211/175 |
| 6,655,534 B2 * | 12/2003 | Williams | H05K 7/183 | 211/190 |
| 6,769,551 B2 * | 8/2004 | Rafferty | H05K 7/1492 | 211/192 |
| 6,863,188 B2 * | 3/2005 | Besserer | A47B 88/43 | 211/175 |
| 6,866,154 B2 * | 3/2005 | Hartman | G06F 1/183 | 211/191 |
| 6,938,967 B2 * | 9/2005 | Dubon | H05K 7/1421 | 312/330.1 |
| 6,948,691 B2 * | 9/2005 | Brock | H02B 1/34 | 211/175 |
| 6,962,397 B2 * | 11/2005 | Dobler | A47B 88/407 | 312/333 |
| 7,137,512 B2 * | 11/2006 | Nguyen | G06F 1/183 | 211/26 |
| 7,281,633 B2 * | 10/2007 | Hartman | G06F 1/183 | 211/192 |
| 7,494,101 B2 * | 2/2009 | Chen | A47B 88/43 | 211/192 |
| 7,641,297 B2 * | 1/2010 | Huang | H05K 7/1489 | 211/26 |
| 8,801,122 B2 * | 8/2014 | Chapel | H05K 7/1489 | 312/334.4 |
| 8,851,300 B2 * | 10/2014 | Dykstra | A47B 46/00 | 211/1.57 |
| 8,876,231 B2 * | 11/2014 | Chen | A47B 88/04 | 312/334.14 |
| 9,131,769 B2 * | 9/2015 | Obernesser | H05K 7/1488 | |
| 9,326,414 B2 * | 4/2016 | Eberle, Jr. | H05K 7/1489 | |
| 9,629,276 B2 * | 4/2017 | Sampath | H05K 7/1489 | |
| 9,943,003 B2 * | 4/2018 | Segroves | H05K 7/1489 | |
| 10,034,406 B2 * | 7/2018 | Chapel | H05K 7/1489 | |
| 2002/0101721 A1 | 8/2002 | Blood | | |
| 2003/0161134 A1 * | 8/2003 | Besserer | H02B 1/34 | 361/826 |
| 2006/0000961 A1 * | 1/2006 | Wei-Chieh | G06F 1/184 | 248/223.41 |
| 2006/0274508 A1 | 12/2006 | LaRiviere | | |
| 2007/0039913 A1 * | 2/2007 | Chen | A47B 88/43 | 211/192 |
| 2008/0290051 A1 | 11/2008 | Manzi | | |
| 2012/0091075 A1 * | 4/2012 | Chapel | H05K 7/1489 | 211/26 |
| 2012/0288221 A1 * | 11/2012 | Jahrling | A47B 88/044 | 384/20 |
| 2014/0265785 A1 * | 9/2014 | Chen | A47B 88/04 | 312/334.1 |
| 2015/0022071 A1 * | 1/2015 | Chen | G07F 11/04 | 312/334.8 |
| 2015/0090679 A1 | 4/2015 | Obernesser | | |
| 2015/0163953 A1 * | 6/2015 | Chapel | H05K 7/1489 | 29/428 |
| 2015/0296982 A1 * | 10/2015 | Chen | A47B 88/044 | 312/334.8 |

FOREIGN PATENT DOCUMENTS

| | | |
|---|---|---|
| JP | H07-29891 U | 6/1995 |
| JP | H07-29892 U | 6/1995 |
| JP | 2003-23278 A | 1/2003 |
| JP | 3196094 U | 2/2015 |

* cited by examiner

RAIL MOUNTING ADAPTER ASSEMBLY FOR RACK

BACKGROUND OF THE INVENTION

Field of the Invention

The present invention relates to a rail mounting adapter assembly, and more particularly, to a rail mounting adapter assembly for a rack.

Description of the Prior Art

Generally, a rack system (or a cabinet system) usually comprises a plurality of posts, and each of the posts has a plurality of mounting holes, such as round holes or square holes. Wherein, distances between the posts and spacing between the mounting holes of each post are defined by related specification. For example, EIA-310 specification of Electronic Industries Association specifies that a width between two posts at left and right sides of the rack (or cabinet) is 19 inch (482.6 mm). The width allows the rack to accommodate a chassis (or an electronic apparatus, an information apparatus etc.). The EIA-310 specification also specifies arrangement of the mounting holes of the posts. Every three mounting holes are considered as a rack unit. Each of the rack unit has a vertical dimension equal to 1.750 inch (44.45 mm), and vertical hole spacing between the mounting holes of the rack unit is 0.625 inch (15.9 mm).

Figure 1:
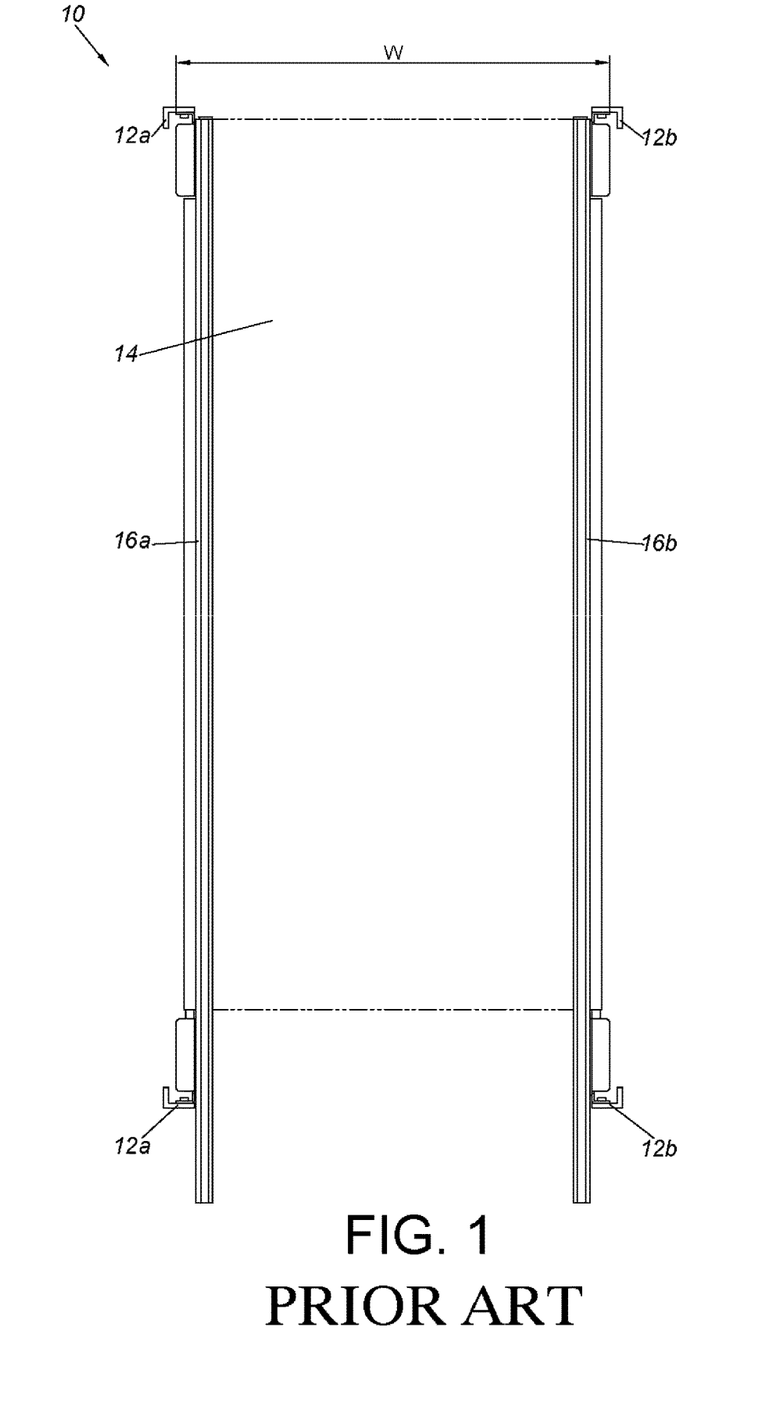
FIG. 1 is a diagram showing a rack system of the prior art.

Please refer to FIG. 1. FIG. 1 is a diagram showing an EIA-310 specified width W between two posts 12a, 12b at two sides of a rack (or cabinet) 10. The width W allows the rack 10 to accommodate a chassis 14. Wherein, left and right sides of the chassis 10 usually are mounted to the posts 12a, 12b at two sides of the rack through a pair of slide rail assemblies 16a, 16b.

With rapid development of information technology, dimensions (such as a width dimension) of a chassis are getting bigger to accommodate more electronic apparatuses or related components. Therefore, for accommodating larger chassis, it is important to provide a rack (or cabinet) having a width between two posts greater than the width specified by the EIA-310 specification.

U.S. Pat. No. 9,131,769 B2 discloses an open bridging rack. Wherein, the background technique of this case discloses an Open Compute Project (OCP) providing an open rack standard comprising specifications for an equipment rack, known as an open rack. Wherein, the OCP-compliant rack provides an approximately 21-inch (538 mm) opening for mounting wider IT equipment. Furthermore, the OCP-compliant rack and the EIA-compliant rack are not compatible with each other since the specifications of them are different.

Moreover, according to the case, an advantage of the open bridging rack is that it provides a single equipment rack that can bridge the gap between the standard EIA 19" rack design and the developing OCP Open Rack design, with an ability to convert from one standard to the other. The open bridging rack provides a pair of front mounting rails 101f, 102f and a pair of rear mounting rails 101r, 102r. Each of the mounting rails (take the front mounting rail 101f for example) has a first planar surface (301), a second planar surface (302), a third planar surface (303) and a fourth planar surface (304). Wherein, a first plurality of equipment-mounting apertures (306) are arranged on the first planar surface (301), and comply with EIA standard. On the other hand, a second plurality of equipment-mounting apertures (301a-310d) are formed on the third planar surface (303) and the fourth planar surface (304), and comply with the OCP standard.

Obviously, it is important to provide an adapter mechanism to adapt the chassis to the racks of both standards.

SUMMARY OF THE INVENTION

The present invention provides a rail mounting adapter assembly for a rack.

According to an embodiment of the present invention, a rail mounting adapter assembly is configured to be mounted on a rack. The rack has a plurality of first mounting features and a plurality of second mounting features arranged on a side of the rack. The rail mounting adapter assembly comprises a first base and a second base. The first base comprises a first side plate and a first end plate substantially perpendicularly connected to the first side plate. Wherein, the first side plate is detachably mounted at a first position on the side of the rack. The first end plate has a plurality of first mounting holes. The second base comprises a second side plate and a second end plate. Wherein, the second side plate is detachably mounted at a second position on the side of the rack. The second end plate corresponds to the first endplate of the first base. The second end plate has a plurality of second mounting holes.

Preferably, the rail mounting adapter assembly further comprises a supporting body extendedly connected between the first base and the second base.

Preferably, the rail mounting adapter assembly further comprises a fastening member mounted on the first base. Wherein, the fastening member comprises an elastic part and an engaging part. The elastic part is configured to provide an elastic force. The engaging part is configured to be engaged with one of the first mounting features on the side of the rack in response to the elastic force of the elastic part.

Preferably, the supporting body comprises a supporting protrusion. The supporting protrusion is configured to be engaged with one of the second mounting features on the side of the rack.

Preferably, the rack further has a plurality of third mounting features arranged on the side of the rack. The second side plate of the second base is configured to be engaged with two of the third mounting features on the side of the rack.

Preferably, the supporting body comprises an auxiliary protrusion. The auxiliary protrusion is configured to be engaged with one of the first mounting features on the side of the rack.

According to another embodiment of the present invention, a rack system comprises a rack, a first adapter mechanism, a second adapter mechanism, a first slide rail assembly, a second slide rail assembly and a chassis. The rack has a first side and a second side. Wherein, a first width is defined between an inner face of the first side and an inner face of the second side. The first adapter mechanism is detachably mounted to the first side of the rack. The second adapter mechanism is detachably mounted to the second side of the rack. Wherein, a second width is defined between the second adapter mechanism and the first adapter mechanism. The second width is smaller than the first width. The first slide rail assembly is mounted to the first adapter mechanism. The second slide rail assembly is mounted to the second adapter mechanism. The chassis is mounted to the first slide rail assembly and the second slide rail assembly.

Preferably, the first adapter mechanism comprises a first base and a second base. The first base comprises a first side plate and a first endplate substantially perpendicularly connected to the first side plate. The first end plate has a plurality of first mounting holes configured to mount a portion of the first slide rail assembly. The second base comprises a second side plate and a second end plate. The second end plate corresponds to the first end plate of the first base. The second end plate has a plurality of second mounting holes configured to mount another portion of the first slide rail assembly. The rack has a plurality of first mounting features, a plurality of second mounting features and a plurality of third mounting features arranged on the first side of the rack.

Preferably, the rack system further comprises a supporting body extendedly connected between the first base and the second base.

Preferably, the rack system further comprises a fastening member mounted on the first base. Wherein, the fastening member comprises an elastic part and an engaging part. The elastic part is configured to provide an elastic force. The engaging part is configured to be engaged with one of the first mounting features of the rack in response to the elastic force of the elastic part.

Preferably, the supporting body comprises a supporting protrusion. The supporting protrusion is configured to be engaged with one of the second mounting features of the rack.

Preferably, the second side plate of the second base is configured to be engaged with two of the third mounting features of the rack.

Preferably, the second width meets a width requirement of EIA-310 specification.

Preferably, spacing between the plurality of first mounting holes of the first end plate and spacing between the plurality of second mounting holes of the second end plate meet hole spacing requirements of EIA-310 specification.

According to yet another embodiment of the present invention, a rack system comprises a rack, a first adapter mechanism and a second adapter mechanism. The rack has a first side and a second side. Wherein, a first width is defined between an inner face of the first side and an inner face of the second side. The first adapter mechanism is detachably mounted to the first side of the rack. The second adapter mechanism is detachably mounted to the second side of the rack. Wherein, a second width is defined between the second adapter mechanism and the first adapter mechanism. The second width is smaller than the first width. Wherein, the second width meets a width requirement of EIA-310 specification.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
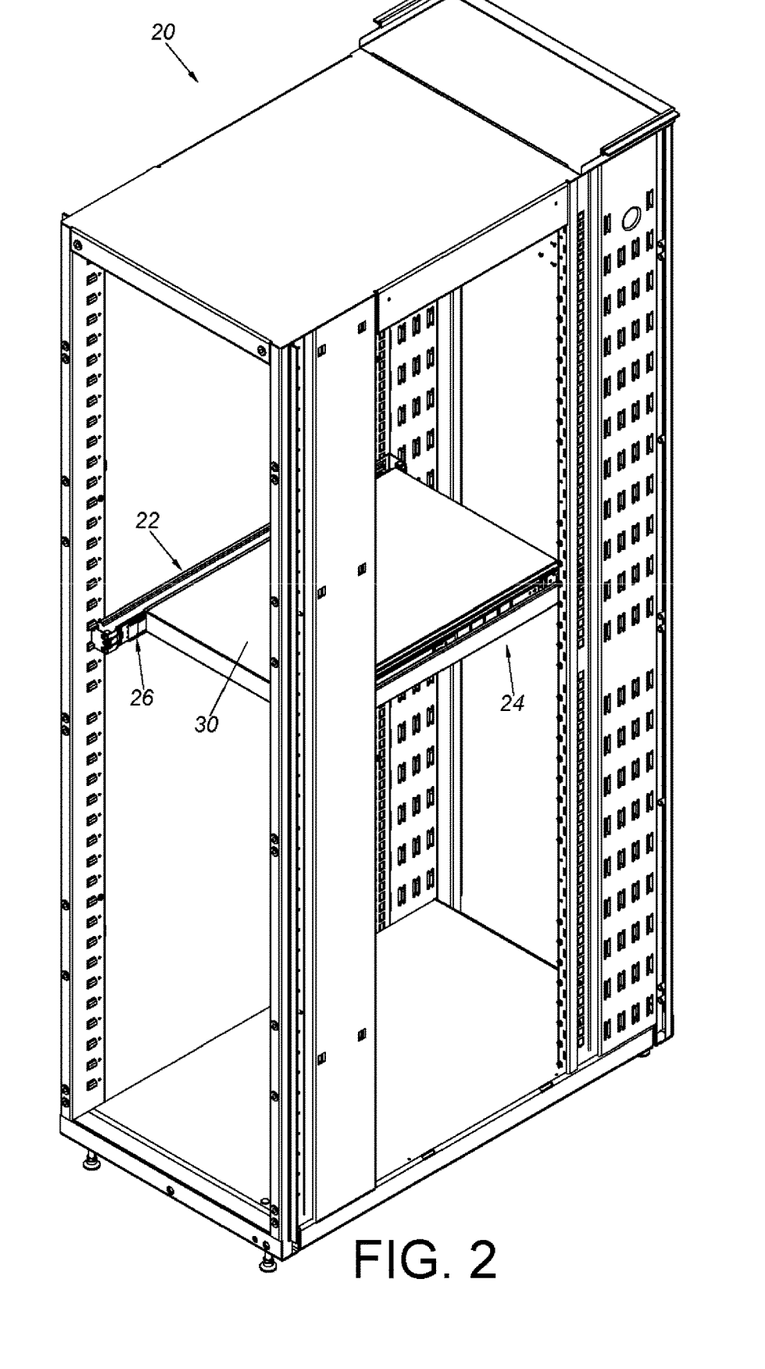
FIG. 2 is a diagram showing a rack system according to an embodiment of the present invention.

As shown in FIG. 2, a rack system comprises a rack 20, a first adapter mechanism 22 and a second adapter mechanism 24. Preferably, the rack system further comprises a first slide rail assembly 26, a second slide rail assembly (not shown in FIG. 2 due to viewing angle) and a chassis 30. Wherein, the rack 20 is an open rack (OCP-compliant rack) allowing a user to easily access apparatuses in the rack.

Figure 3:
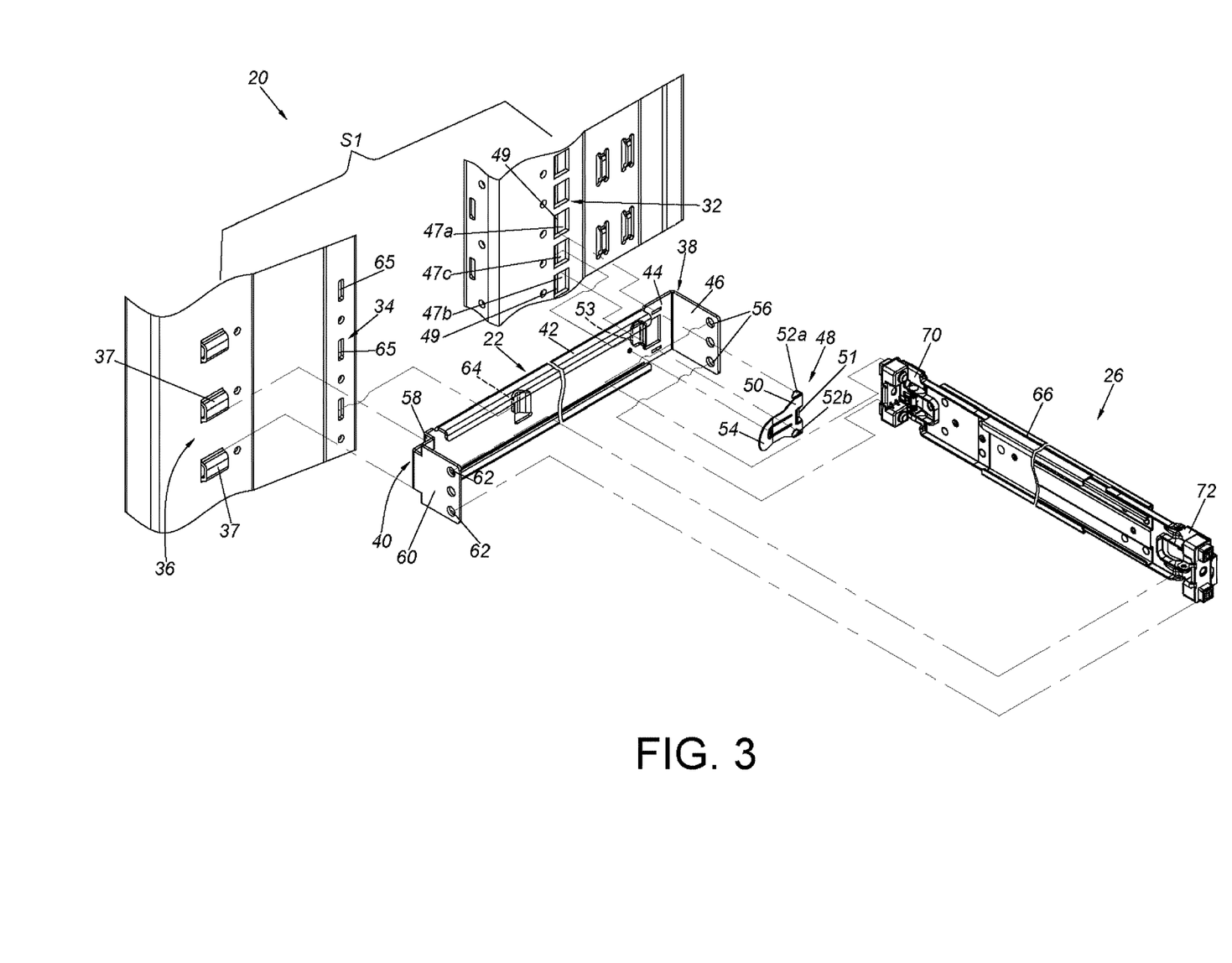
FIG. 3 is an exploded view of a rail mounting adapter assembly, a slid rail assembly and a rack according to an embodiment of the present invention.
Figure 4:
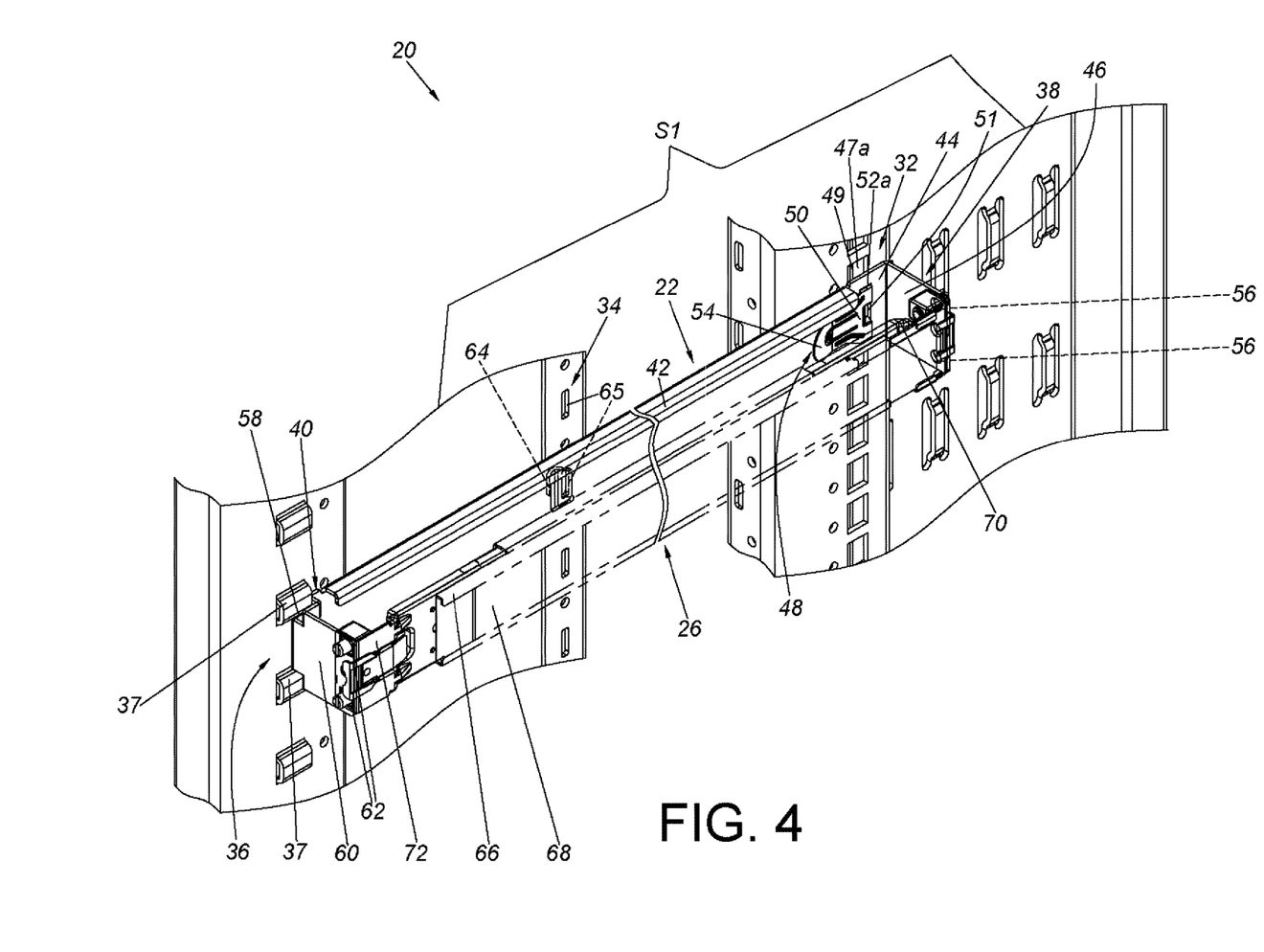
FIG. 4 is an assembly diagram of the rail mounting adapter assembly, the slid rail assembly and the rack according to an embodiment of the present invention.

As shown in FIG. 3 and FIG. 4, the rack 20 has a plurality of first mounting features 32 and a plurality of second mounting features 34 on a first side S1 of the rack 20. Preferably, the rack 20 further has a plurality of third mounting features 36. The first mounting features 32, the second mounting features 34 and the third mounting features 36 are respectively arranged on at least one post (or at least one wall) of the rack 20. In the present embodiment, the first mounting features 32 are arranged on a first post, the second mounting features 34 and the third mounting features 36 are arranged on a second post, but the present invention is not limited thereto.

The first adapter mechanism 22 is detachably mounted to the first side S1 of the rack 20. Specifically, the first adapter mechanism 22 comprises a first base 38 and a second base 40. Preferably, the first adapter mechanism 22 further comprises a supporting body 42 extendedly connected between the first base 38 and the second base 40. Wherein, the first base 38, the second base 40 and the supporting body 42 can be regarded as a rail mounting adapter assembly.

Figure 5:
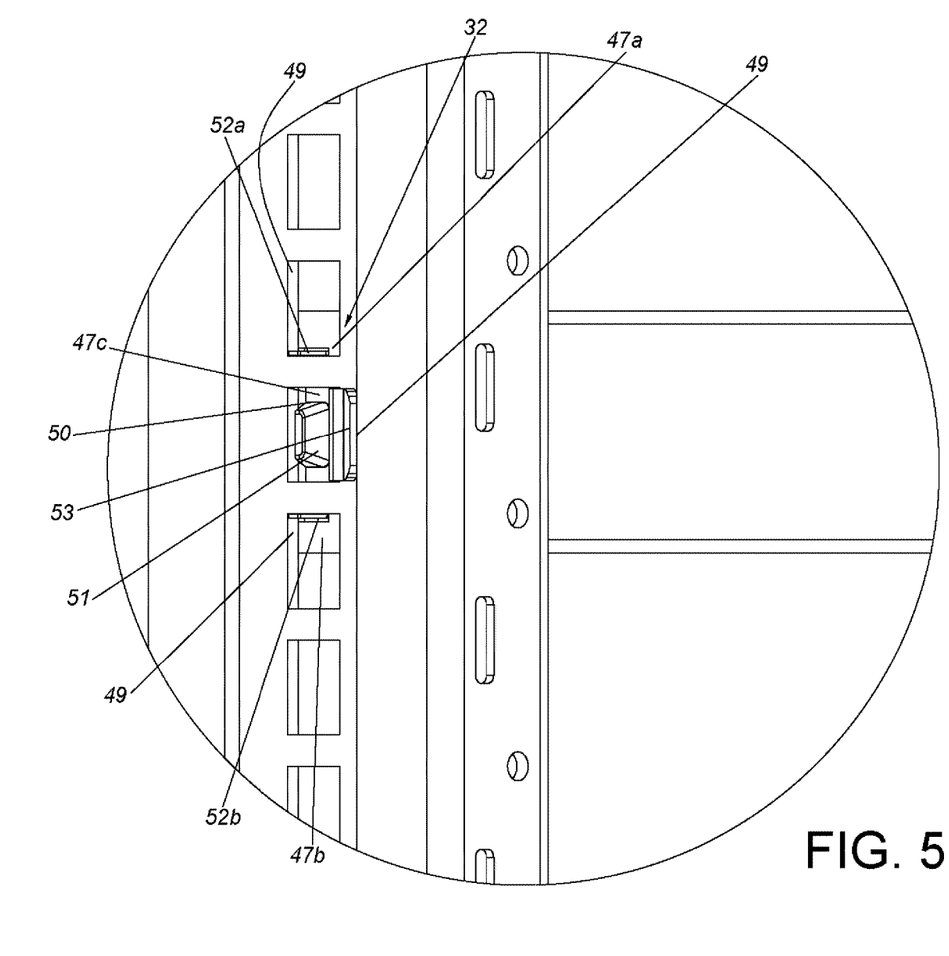
FIG. 5 is a diagram showing engaging parts and an extension part of a fastening member configured to be mounted on the rack according to an embodiment of the present invention.

The first base 38 comprises a first side plate 44 and a first end plate 46 substantially perpendicularly connected to the first side plate 44. Wherein, the first side plate 44 is detachably mounted at a first position on the first side S1 of the rack 20. In the present embodiment, the plurality of first mounting features 32 are a first hole 47a, a second hole 47b and a third hole 47c. Each of the first hole 47a, the second hole 47b and the third hole 47c has a hole wall 49 at periphery, but the present invention is not limited thereto. Preferably, the rail mounting adapter assembly further comprises a fastening member 48 mounted on the first base 38. The first sideplate 44 of the first base 38 can be detachably mounted to the first hole 47a and the second hole 47b through the fastening member 48. For example, the fastening member 48 comprises an elastic part 50, a first engaging part 52a and a second engaging part 52b. Each of the first engaging part 52a and the second engaging part 52b is connected to the elastic part 50. The elastic part 50 is configured to provide an elastic force. The first engaging part 52a and the second engaging part 52b are respectively engaged with the first side S1 of the rack 20 in response to the elastic force of the elastic part 50. For example, the first engaging part 52a and the second engaging part 52b are configured to respectively penetrate through the first hole 47a and the second hole 47b to be engaged with the corresponding hole walls (please refer to FIG. 5). Preferably, the fastening member 48 further comprises an extension part 51 connected to the elastic part 50 and protruded relative to the elastic part 50. The extension part 51 is configured to be mounted to the third hole 47c on the first side S1 of the rack 20 in response to the elastic force of the elastic part 50. In addition, the supporting body 42 comprises an auxiliary protrusion 53 configured to penetrate through one of the holes (such as the third hole 47c) to be engaged with the corresponding hole wall 49. Preferably, the fastening member 48 further comprises an operating part 54 tilted relative to the elastic part 50. The user can apply a force to the operating part 54 to further operate the elastic part 50, such that the elastic part 50 allows the first engaging part 52a, the second engaging part 52b and the extension part 51 to be disengaged from the holes (47a, 47b and 47c) on the first side S1 of the rack 20 in response to the force. On the other hand, a plurality of first mounting holes 56 are formed on the first end plate 46.

The second base 40 comprises a second side plate 58 and a second end plate 60. In the present embodiment, the second end plate 60 is substantially perpendicularly connected to the second side plate 58. Moreover, the second side plate 58 is detachably mounted at a second position on the first side S1 of the rack 20 (such as detachably mounted to the third mounting features 36 on the first side S1). In the present embodiment, the plurality of third mounting features 36 are a plurality of protrusions 37, but the present invention is not limited thereto. The second side plate 58 is configured to be engaged between two of the third mounting features 36. On the other hand, the second end plate 60 corresponds to the first end plate 46 of the first base 38. A plurality of second mounting holes 62 are formed on the second end plate 60. Preferably, spacing between the plurality of second mounting holes 62 of the second end plate 60 and spacing between the plurality of first mounting holes 56 of the first end plate 46 meet hole spacing requirements of EIA-310 specification. Wherein, the EIA-310 specification is disclosed in the description of the prior art, for simplification, no further illustration is provided.

Preferably, the supporting body 42 comprises a supporting protrusion 64. The supporting protrusion 64 is configured to be engaged with one of the second mounting features 34 on the first side S1 of the rack 20. In the present embodiment, the plurality of second mounting features 34 are a plurality of supporting holes, and each of the supporting holes has a hole wall 65 at periphery, but the present invention is not limited thereto. The supporting protrusion 64 of the supporting body 42 is configured to penetrate through one of the supporting holes to be engaged with the corresponding hole wall 65.

The first slide rail assembly 26 is configured to be mounted on the first adapter mechanism 22. The first slide rail assembly 26 comprises a first rail 66 and a second rail 68 movable relative to the first rail 66. Specifically, two portions of the first rail 66 (such as a front portion and a second portion) are configured to be mounted to the first mounting holes 56 and the second mounting holes 62 of the first adapter mechanism 22 respectively through a first bracket 70 and a second bracket 72.

Figure 6:
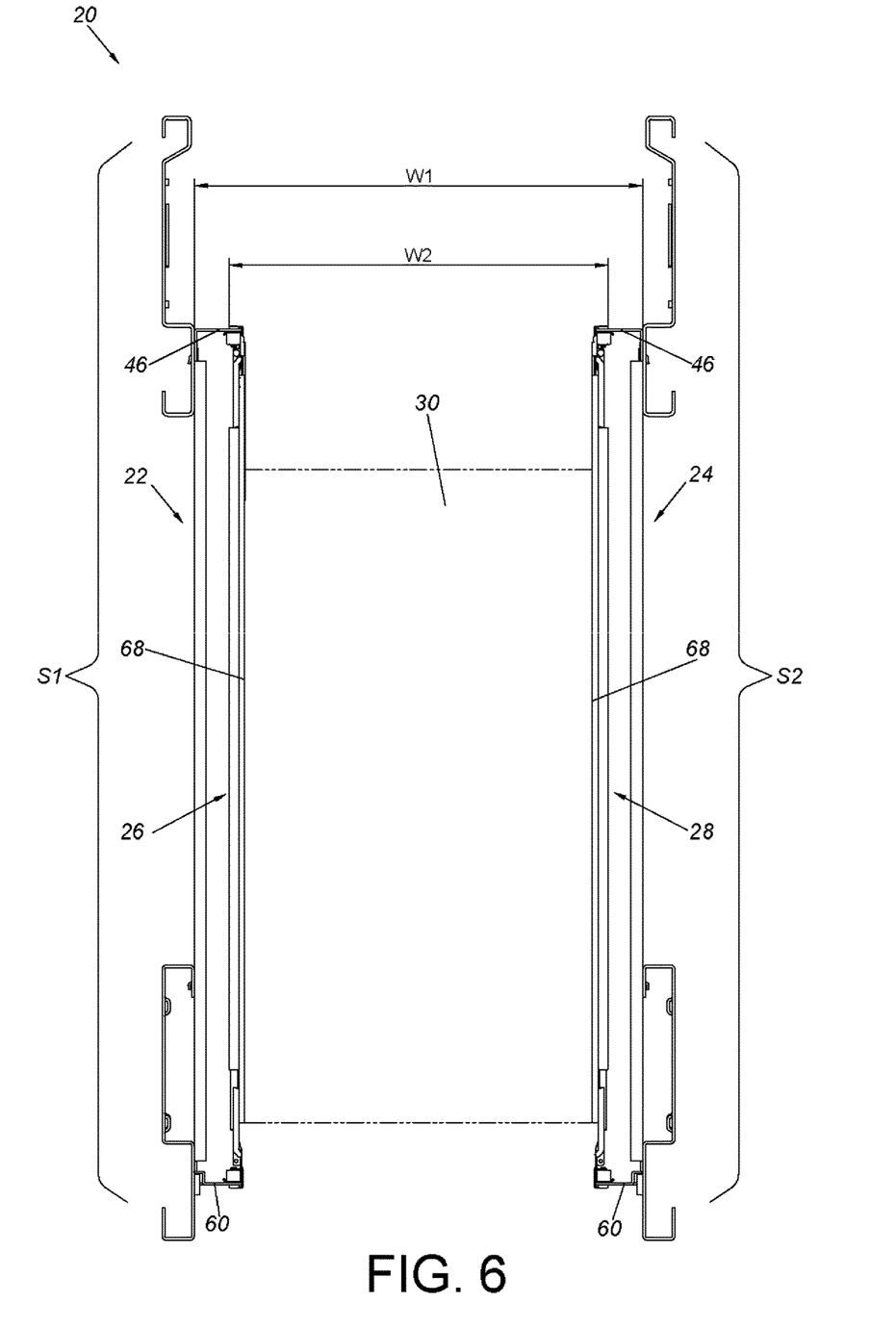
FIG. 6 is a diagram showing a chassis being mounted to the rack through a first adapter mechanism and a second adapter mechanism according to an embodiment of the present invention.

As Shown in FIG. 6, the first adapter mechanism 22 is detachably mounted to the first side S1 of the rack 20. The second adapter mechanism 24 is detachably mounted to the second side S2 of the rack 20. The chassis 30 can be mounted to the first adapter mechanism 22 and the second adapter mechanism 24 respectively through the first slide rail assembly 26 and the second slide rail assembly 28. Wherein, since arrangement of the second side S2 of the rack 20 is identical to arrangement of the first side S1 of the rack 20, arrangement of the second adapter mechanism 24 is identical to arrangement of the first adapter mechanism 22, and arrangement of the second slide rail assembly 28 is identical to arrangement of the first slide rail assembly 26, for simplification, no further illustration for arrangement of the second side S2 of the rack 20, the second adapter mechanism 24 and the second slide rail assembly 28 is provided. Preferably, the chassis 30 is mounted to the second rails 68 of the first slide rail assembly 26 and the second slide rail assembly 28.

Moreover, in the rack system, a first width W1 is defined between an inner face of the first side S1 of the rack 20 and an inner face of the second side S2 of the rack 20. On the other hand, a second width W2 is defined between the first adapter mechanism 22 and the second adapter mechanism 24. For example, the second width W2 is defined between the first endplate 46 of the first adapter mechanism 22 and the first end plate 46 of the second adapter mechanism 24 (or the second width W2 is defined between the second end plate 60 of the first adapter mechanism 22 and the second end plate 60 of the second adapter mechanism 24). Wherein, the second width W2 is smaller than the first width W1. Preferably, the second width W2 meets a width requirement of EIA-310 specification.

As such, the rack 20 with the first width W1 is not able to accommodate the chassis 30 (such as an EIA-310 compliant chassis). Therefore, through respectively mounting the first adapter mechanism 22 and the second adapter mechanism 24 on the first side S1 and the second side S2 of the rack 20, the second width W2 between the first adapter mechanism 22 and the second adapter mechanism 24 allows the rack to accommodate the chassis 30.

Figure 7:
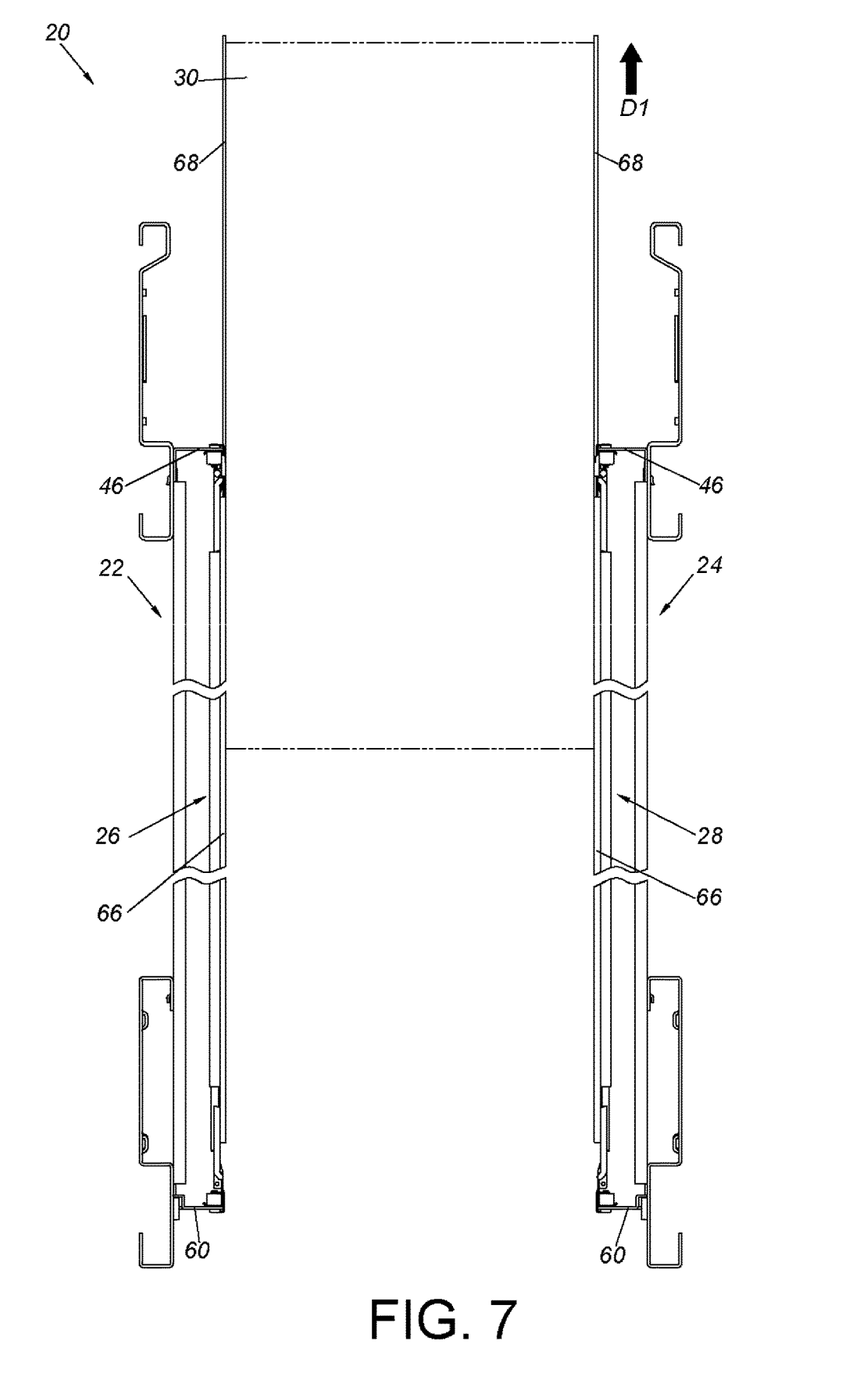
FIG. 7 is a diagram showing the chassis being moved out of the rack through a pair of slide rail assemblies according to an embodiment of the present invention.

As shown in FIG. 7, the chassis 30 can be moved out of the rack 20 along a first direction D1 through moving the second rail 68 relative to the first rail 66 of each of the first slide rail assembly 26 and the second slide rail assembly 28; or the chassis 30 can be moved into the rack 20 to be retracted along a second direction (a direction opposite to the first direction D1).

Figure 8:
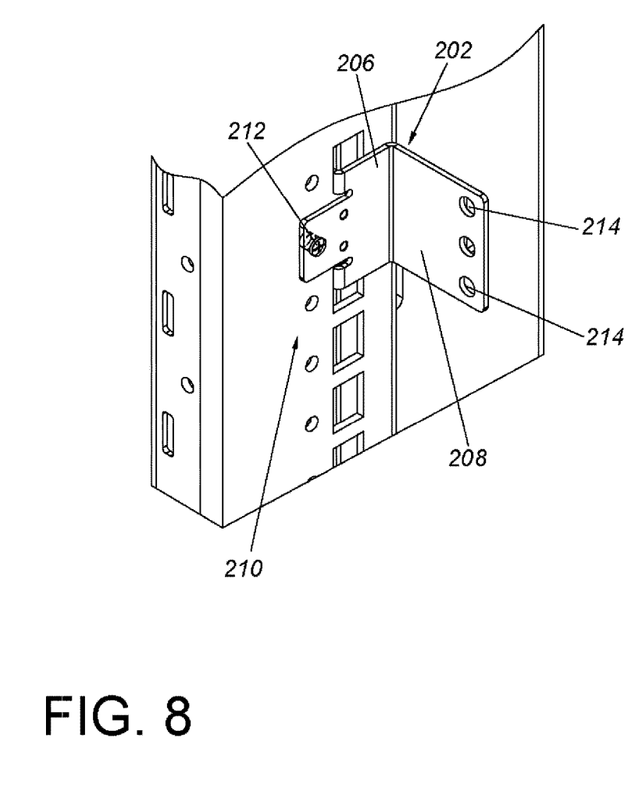
FIG. 8 is a diagram showing a rail mounting adapter assembly being mounted to the rack according to another embodiment of the present invention.

FIG. 8 is a diagram showing a rack system according to another embodiment of the present invention. Specifically, different from the first adapter mechanism 22 comprising the first base 38, the second base 40 and the supporting body 42, the first adapter mechanism (or the second adapter mechanism) of the present embodiment comprises a first base 202 and a second base 204. The first base 202 and the second base 204 can be regarded as a rail mounting adapter assembly.

Moreover, the first base 202 comprises a first side plate 206 and a first end plate 208 substantially perpendicularly connected to the first side plate 206. The first side plate 206 is detachably mounted to one of first mounting features 210 on a side of a rack 200. For example, the first side plate 206 is configured to be mounted to one of the first mounting features 210 on the side of the rack 200 through a first fixing member 212. In the present embodiment, the first mounting features 210 are fixing holes configured to allow the first fixing member 212 to penetrate through. On the other hand, a plurality of first mounting holes 214 are formed on the first end plate 208 and configured to mount a portion of a first slide rail assembly.

Figure 9:
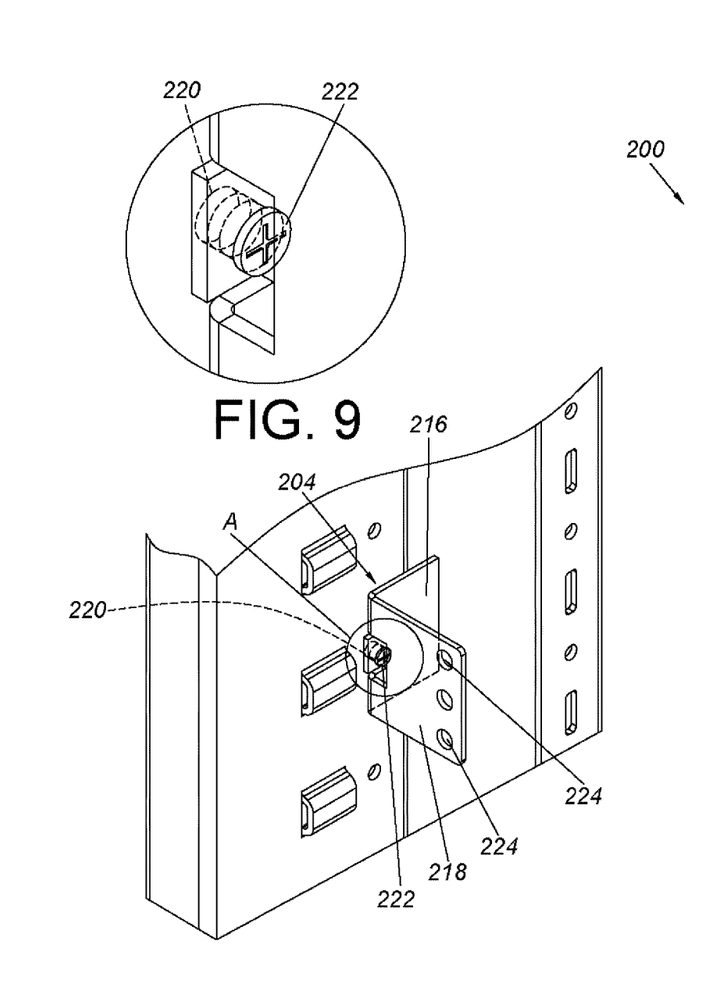
FIG. 9 is an enlarged view of an area A of FIG. 8.

The second base 204 comprises a second side plate 216 and a second endplate 218. The second side plate 216 is detachably mounted to one of third mounting features 220 on the side of the rack 200. For example, the second side plate 216 can be mounted to one of the third mounting features 220 on the side of the rack 200 through a second fixing member 222 (please also refer to FIG. 9). In the present embodiment, the third mounting features 220 are fixing holes configured to allow the second fixing member 222 to penetrate through. On the other hand, the second end plate 218 corresponds to the first end plate 208 of the first base 202. A plurality of second mounting holes 224 are formed on the second end plate 218 and configured to mount another portion of the first slide rail assembly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rail mounting adapter assembly configured to be mounted on a rack, the rack having a plurality of first mounting features and a plurality of second mounting features arranged on a side of the rack, the rail mounting adapter assembly being configured to mount a slide rail assembly to the rack and comprising:
    a first base comprising a first side plate and a first end plate substantially perpendicularly connected to the first side plate, wherein the first side plate is detachably mounted at a first position on the side of the rack, the first end plate has a plurality of first mounting holes, the plurality of first mounting holes being configured to be mounted with an end of the slide rail assembly;
    a second base comprising a second side plate and a second end plate substantially perpendicularly connected to the second side plate, wherein the second side plate is detachably mounted at a second position on the side of the rack, the second end plate has a plurality of second mounting holes, the plurality of second mounting holes being configured to be mounted with another end of the slide rail assembly;
    a fastening member comprising an operating part, an extension part, and an elastic part, wherein the operating part is tilted relative to the elastic part, the elastic part is configured to provide an elastic force, the operating part is configured to be operated such that the elastic part allows the extension part to be disengaged from one of the first mounting features; and
    a supporting body extendedly connected between the first base and the second base, wherein the supporting body is spaced from the slide rail assembly.

2. The rail mounting adapter assembly of claim 1, wherein the fastening member is mounted on the first base, the fastening member further comprises an engaging part configured to be engaged with one of the first mounting features on the side of the rack in response to the elastic force of the elastic part.

3. The rail mounting adapter assembly of claim 1, wherein the supporting body comprises a supporting protrusion, the supporting protrusion is configured to be engaged with one of the second mounting features on the side of the rack.

4. The rail mounting adapter assembly of claim 1, wherein the rack further has a plurality of third mounting features arranged on the side of the rack, the second side plate of the second base is configured to be engaged with two of the third mounting features on the side of the rack.

5. The rail mounting adapter assembly of claim 1, wherein the supporting body comprises an auxiliary protrusion, the auxiliary protrusion is configured to be engaged with one of the first mounting features on the side of the rack.

6. The rail mounting adapter assembly of claim 4, wherein the plurality of third mounting features are protrusions arranged on the side of the rack.

* * * * *